(12) United States Patent
Scarzello et al.

(10) Patent No.: US 6,278,272 B1
(45) Date of Patent: Aug. 21, 2001

(54) INTEGRATING FLUXGATE MAGNETOMETER

(75) Inventors: John F. Scarzello; John J. Holmes; Edward C. O'Keefe, all of Columbia, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/517,558

(22) Filed: Mar. 2, 2000

Related U.S. Application Data
(60) Provisional application No. 60/123,176, filed on Mar. 5, 1999.

(51) Int. Cl.[7] .................................................. G01R 33/04
(52) U.S. Cl. .......................................................... 324/253
(58) Field of Search ................................... 324/253, 254, 324/255, 326, 260, 244, 258

(56) References Cited

U.S. PATENT DOCUMENTS

| | | | |
|---|---|---|---|
| 3,821,637 | 6/1974 | Svala | 324/222 |
| 4,068,164 | 1/1978 | Schwartz et al. | 324/226 |
| 4,502,010 | * 2/1985 | Kuckes | 324/338 |
| 5,008,621 | 4/1991 | Jiles | 324/227 |
| 5,014,006 | * 5/1991 | Seitz | 324/249 |
| 5,329,269 | 7/1994 | Watson | 336/213 |
| 5,939,881 | * 8/1999 | Slater et al. | 324/253 |

OTHER PUBLICATIONS

Scarzello, John F. and Edward C. O'Keefe, "Development of Shipboard Magnetic Sensors for Degaussing System Controllers," NSWCCD–TR–98/011, Jun. 30, 1998, Machinery Research and Development Directorate Research and Development Report, Naval Surface Warfare Center, Carderock Division, West Betgesda, Maryland 20817–5700.

Lenz, James E., "A Review of Magnetic Sensors," IEEE Proceedings, vol. 78, No. 6, Jun. 1990, pp. 973–989.

Gordon, Daniel I., Robert E. Brown and John F. Haben, "Methods for Measuring the Magnetic Field," *IEEE Trans. Mag.*, vol. Mag–8, No. 1, Mar. 1972, pp. 48–51.

Gordon, Daniel I. and Robert E. Brown, "Recent Advances in Fluxgate Magnetometry," *IEEE Trans. Mag.*, vol. Mag–8, No. 1, Mar. 1972, pp. 76–82.

Gordon, D. I., R. H. Lundsten, R. A. Chiarodo, H. H. Helms, "A Fluxgate Sensor of High Stability for Low Field Magnetometry," *IEEE Transactions on Magnetics*, vol. Mag–4, 1968, pp. 379–401.

Acuna, M. H., "Fluxgate Magnetometers for Outer Planets Exploration," *IEEE Transactions on Magnetics*, vol. Mag–10, 1974, pp. 519–523.

Ripka, Pavel, "Review of Fluxgate Sensors," *Sensors and Actuators A*, 33 (1992), pp. 129–141.

(List continued on next page.)

*Primary Examiner*—Jay Patidar
(74) *Attorney, Agent, or Firm*—Howard Kaiser

(57) ABSTRACT

A magnetic field sensor based on fluxgate magnetometric principles includes a magnetic core having an elongated oblong configuration and accordingly defining a closed magnetic flux path. The core includes a rigid bobbin which defines the core's shape, and about which amorphous magnetic material is wrapped. A drive winding is wound about each of the two parallel linear sections of the core. A sense winding is wound about another rigid bobbin which surrounds the drive winding-wound core. Typically, a feedback winding is wound about another rigid bobbin which surrounds the sense winding. When, for sensing purposes, the driven sensor is situated near and parallel to a ferromagnetic material surface, the sensor is capable of generating a detectable signal which is representative of the "integration" of magnetic field components over the length of the core. The invention's integrative function minimizes measurement skewing or distortion attributable to anomalous characteristics of the ferromagnetic material being sensed.

20 Claims, 5 Drawing Sheets

OTHER PUBLICATIONS

Ripka, Pavel, "Race–Trakc Fluxgate Sensors," *Sensors and Actuators*; A 37–38 (1993), pp. 417–421.

Ripka, Pavel, K. Draxler, P. Kaspar, "Race–Track Fluxgate Gradiometer," *Electronic Letters*, 29 (1993), pp. 1193–1194.

Ripka, Pavel, "Magnetic Sensors for Industrial and Field Applications," *Sensors and Actuators A*, 42 (1994), Nos. 1–3, pp. 394–397.

Ripka, Pavel, F. Primdahl, I.V. Nielsen, J.R. Petersen, A. Ranta, "AC Magnetic Field Measurement Using the Fluxgate," *Sensors and Actuators A*, 46–47 (1995), pp. 307–311.

Ripka, Pavel, P. Kaspar, "Portable Fluxgate Magnetometer," *Sensors and Actuators A*, 68 (1998), pp. 286–289.

Russell, C.T., "The ISEE 1 and 2 Fluxgate Magnetometers," orig. in *Transactions on Geoscience Electronics*, vol. GE–16, No. 3, Jul. 1978.

Russell, C.T., R.C. Snare, J.D.Means and R.C. Elphic, "Pioneer Venus Orbiter Fluxgate Magnetometer," orig. in *IEEE Transactions on Geoscience and Remote Sensing*, GE–18, 32–36, 1980.

Snare, Robert C., "A History of Vector Magnetometry in Space," Institute of Geophysics and Planetary Physics, University of California, Los Angeles.

Ripka, Pavel, M. Tondra, J. Stokes and R. Beech, "AC–Driven AMR and GMR Magnetoresistors," *Sensors and Actuators A* (1999), vol. 76, pp. 227–232.

Ripka, Pavel, S.W. Billingsley, "Crossfield Effect at Fluxgate," *Sensors and Actuators* (2000), vol. 81, Nos. 1–3, pp. 176–179.

Ripka, Pavel and F. Primdahl, "Tuned Current–Output Fluxgate," accepted for publication in *Sensors and Actuators A* (2000).

Ripka, Pavel, "New Directions in Fluxgate Sensors," accepted for publication in *JMMM* (2000).

Ripka, Pavel, "Race–Track Fluxgate with Adjustable Feedthrough," accepted for publication in *Sensors and Actuators A* (2000).

Ripka, Pavel, P. Kaspar, P. Navratil, A. Tipek, K. Svabova, "Fluxgate Magnetopneumography," Imeko World Congress, Osaka 1999.

Ripka, Pavel, S. Kawahito, "Processing of the Fluxgate Output Signal," Imeko World Congress, Osaka 1999.

Ripka, Pavel, "Magnetic Sensors for Traffic Control," ISMCR 1999.

Kaspar, P, Pavel Ripka, "Induction Coils: Voltage Versus Current Output," Imeko World Congress, Vienna 2000.

Ripka, Pavel, P. Kaspar, A. Tipek, K. Svabova, "Magnetic Lung Diagnostics Using Fluxgate," Imeko World Congress, Vienna 2000.

* cited by examiner

INTEGRATING FLUXGATE MAGNETOMETER

CROSS-REFERENCE TO RELATED APPLICATIONS

This application claims the benefit of U.S. provisional application No. 60/123,176, filed Mar. 5, 1999, hereby incorporated herein by reference, entitled "Integrating Fluxgate Magnetometer and Spatially Integrating Magnetometer."

This application is related to U.S. nonprovisional application Ser. No. 09/262,932, filed Mar. 5, 1999, hereby incorporated herein by reference, entitled "Standing Wave Magnetometer."

This application is related to the nonprovisional application being filed concurrently herewith, hereby incorporated herein by reference, entitled "Spatially Integrating Magnetometer," joint inventors John F. Scarzello, John, J. Holmes and Edward C. O'Keefe.

This application is related to the nonprovisional application being filed concurrently herewith, hereby incorporated herein by reference, entitled "Hull Surface Magnetic Field Sensor," joint inventors John F. Scarzello, John J. Holmes and Edward C. O'Keefe.

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

The present inventions relate to methods, systems and apparatuses for performing measurement pertaining to magnetic field, more particularly to such methods, systems and apparatuses for measuring one or more components of a magnetic field over a linear region.

Ships and submarines are constructed of ferromagnetic materials which produce magnetic field signatures, making them detectable and vulnerable to magnetic influence sea mines and detectable by airborne magnetic anomaly detection (MAD) and underwater electromagnetic surveillance systems.

To reduce the magnetic field signature of ships and submarines, coils are wrapped around the ferromagnetic hull, and fields produced which reduce the vessel's signature. In order to control the coil currents, a degaussing (DG) system must have sensors which accurately measure the signature related magnetic fields, and control algorithms to extrapolate the spatially measured field values to regions under the ship, and adjust the coil currents to minimize the signature amplitude.

It is useful to measure magnetic fields near the hull of naval ships and submarines, so that such measured magnetic fields can be used to control advanced degaussing systems. A large number of "point" sensors are presently employed, but they are expensive and not capable of satisfying the need for measuring fields at all points along the circumference of a ship or submarine hull. It is important to measure these fields produced by local hull anomalies (welds, stresses, bulkheads, etc.) and material inhomogeneities at many locations, for more effective control of the ship's degaussing system. Ideally, by measuring the surface magnetic fields all over the hull (and thereby continuously monitoring the magnetic state of a ship or submarine hull), the magnetic field signature of the ship can be adjusted and maintained at a low level using an advanced degaussing system such as the U.S. Navy's Advanced Closed Loop Degaussing System, thereby making a ship less vulnerable to sea mine magnetic influence fuzes.

Advanced degaussing systems require accurate and spatially distributed magnetic field measurements around the ship, so that ship mathematical model algorithms can precisely control magnetic field signatures below the ship. Some of the problems associated with measuring these fields include: large spatial gradient magnetic fields; local magnetic anomalies; induced magnetic fields caused by heading changes; and, permanent magnetization changes due to pressure-induced hull stresses. Such measurements have been made using traditional fluxgate magnetometers, short baseline gradiometers, etc.

In some cases, there are large spatial magnetic field gradients, close to the hull, which are produced by local hull anomalies (e.g., welds, stresses, bulkheads, etc.) and material inhomogeneities. "Point" triaxial fluxgate magnetometers and gradiometers are presently used to measure these spatial gradients; however, because of these local effects, field measurements at many locations may be not be useful for controlling the shipboard degaussing system.

Fluxgate magnetometers measure the magnetic field intensity using a variety of transducer cores which, normally, are considered to be small "point" field sensors (typically, about one to two inches in length). More generally, fluxgate, fiber-optic and other magnetic field sensitive transducer phenomena measure the magnetic field intensity using a variety of transducer cores which are normally considered point field measurements (wherein the transducers are typically about one to two inches in length).

Pertinent background information is provided by the following papers, each of which is hereby incorporated herein by reference: Lenz, J. E., "A Review of Magnetic Sensors," *IEEE Proceedings,* Vol. 78, No. 6, June 1990; Gordon, D. I., R. E. Brown and J. F. Haben, "Methods for Measuring the Magnetic Field," *IEEE Trans. Mag.,* Vol. Mag-8, No. 1, March 1972; Gordon, D. I. and R. E. Brown, "Recent Advances in Fluxgate Magnetometry," *IEEE Trans. Mag.,* Vol. Mag-8, No. 1, March 1972; Gordon, D. I., R. H. Lundsten, R. A. Chiarodo, H. H. Helms, "A Fluxgate Sensor of High Stability for Low Field Magnetometry," *IEEE Transactions on Magnetics,* vol. MAG-4, 1968, pp 379–041; Acuna, M. H., "Fluxgate Magnetometers for Outer Planets Exploration," *IEEE Transactions on Magnetics,* vol. MAG-10, 1974, pp. 519–23.

SUMMARY OF THE INVENTION

In view of the foregoing, it is an object of the present invention to provide method, apparatus and system for measuring magnetic field distribution in a sector of interest—e.g., a distance, an area or a volume—which includes a plurality of different spatial points (i.e., discrete locations in space).

It is another object of the present invention to provide such method, apparatus and system which are more efficient than conventional methods, apparatuses and systems.

It is a further object of this invention to provide such method, apparatus and system which are more economical than conventional methods, apparatuses and systems.

It is another object of this invention to provide such method, apparatus and system which are more reliable than conventional methods, apparatuses and systems.

Another object of the present invention to provide method, apparatus and system for continuously measuring same, for use in association with a magnetic control system such as a ship degaussing system.

According to many inventive IFM embodiments, an "integrating" fluxgate transducer magnetometer measures the magnetic field amplitude component over a linear region, and "integrates" the measured values to obtain the sum of the field component amplitudes over the length of the fluxgate transducer magnetometer's sensor element. A typical inventive Integrating Fluxgate Magnetometer (IFM) is a fluxgate magnetometer having a rigid transducer core which is configured as a long "racetrack" in order to integrate large component gradient magnetic fields near a ferromagnetic entity, e.g., a ship hull or a large piece of machinery. A typical inventive IFM: (i) measures magnetic fields over the length of its elongated transducer element (e.g., the 30 cm length of an inventive prototype tested by the U.S. Navy), and (ii) spatially integrates the component field amplitudes.

In accordance with many embodiments of the present invention, a fluxgate magnetometer comprises a magnetic core, two drive windings and a sense winding. The magnetic core is characterized by a closed magnetic flux path, a core length, a core width and a ratio of the core length to the core width of at least ten. The magnetic core has two approximately straight approximately equal lengthwise core portions and two arcuate end portions. The lengthwise core portions are approximately oriented in rectangular parallel relation. Each lengthwise core portion is characterized by approximately the same lengthwise core portion length, which is substantially the core length. Each drive winding is wound over one lengthwise core portion. The sense winding is wound encompassingly with respect to the combination of the two lengthwise core portions and the two drive windings. Typically, the fluxgate magnetometer is adaptable to transmitting, via the sense winding, an electrical signal which is integratively indicative of the sensed magnetic field components over the lengthwise core portion length.

Certain conventional fluxgate magnetometers implement a magnetic core having the "closed" (or "closed loop") configuration; that is, the shape of the magnetic core describes a geometrically closed figure. In other words, a closed magnetic core has a closed magnetic flux path. Two closed core configurations which are known in the art are the "ring core" and the "racetrack core" configurations. See, e.g., the following references, each of which is incorporated herein by reference: Pavel Ripka, "Review of Fluxgate Sensors," *Sensors and Actuators A*, 33 (1992), pp 129–141; Pavel Ripka "Race-Track Fluxgate Sensors," *Sensors and Actuators;* A, 37–38 (1993), pp 417–421; Pavel Ripka, Draxler K., Kaspar P., "Race-Track Fluxgate Gradiometer," *Electronic Letters*, 29 (1993), pp 1193–1194; Pavel Ripka, "Magnetic Sensors for Industrial and Field Applications," *Sensors and Actuators A*, 42 (1994), nos. 1–3, pp 394–397; Pavel Ripka, F. Primdahl, I. V. Nielsen, J. R. Petersen, A. Ranta, "AC Magnetic Field Measurement Using the Fluxgate," *Sensors and Actuators A*, 46–47 (1995), pp 307–311; Pavel Ripka, P. Kaspar, "Portable Fluxgate Magnetometer," *Sensors and Actuators A*, 68 (1998), pp 286–289.

The National Aeronautics and Space Administration and the Naval Surface Warfare Center, White Oak (now closed) have developed ring core fluxgate magnetometers; see, e.g., the above-mentioned references Gordon, D. I. and R. E. Brown, "Recent Advances in Fluxgate Magnetometry," *IEEE Trans. Mag.*, Vol. Mag-8, No. 1, March 1972; Gordon, D. I., R. H. Lundsten, R. A. Chiarodo, H. H. Helms, "A Fluxgate Sensor of High Stability for Low Field Magnetometry," *IEEE Transactions on Magnetics*, vol. MAG-4, 1968, pp 379–401; Acuna, M. H. "Fluxgate Magnetometers for Outer Planets Exploration," *IEEE Transactions on Magnetics*, vol. MAC-10, 1974, pp 519–23.

It is noted that the conventional ring core and racetrack core magnetometers basically accomplish the same purpose, viz., to measure the magnetic field existing at a point in space rather than along a significant distance in space. The conventional racetrack core is essentially a slightly elongated ring core, having a moderately oval shape. A conventional ring core and a conventional racetrack core can each be considered to have a length L and a diameter D. A conventional ring core has a length-to-diameter ratio L/D of approximately one. A conventional racetrack core has a length-to-diameter ratio L/D of greater than one but no greater than about four. Depending on the application, there may be advantages associated with either the ring core or racetrack core; nevertheless, until the present invention, neither magnetometer design has been considered for implementation as anything other than "point" sensors.

By contrast, the present invention uniquely features an extremely elongate closed core having the associated benefit of rendering significantly more expansive magnetic field measurements than mere "point" measurements. In essence, the inventive core is an exceedingly stretched ring core which approximately defines a very elongate racetrack (oval) geometry. The oblong inventive core typically comprises two approximately parallel rectilinear (e.g., approximately linear) side core sections and two curvilinear (e.g., arcuate) end sections.

The inventive fluxgate magnetometer can be thought of as a parallel-gated fluxgate magnetometer having configurational indicia both of a rod-core (two-core) fluxgate magnetometer and a ring-core magnetometer. Like a rod-core sensor, the inventive sensor includes two straight parallel core sections; like a ring-core sensor, the entire inventive core is "closed," wherein the two straight parallel core sections are connected at their respective ends by two curved "end-loop" core sections, thereby closing the drive flux path.

As distinguished from conventional racetrack cores, the inventive cores have a length L and a diameter D wherein the length-to-diameter ratio L/D is at least ten and more typically much greater than ten. For instance, the U.S. Navy's prototype IFM sensor has a length-to-diameter ratio L/D of approximately thirty. In essence, the inventive magnetic core describes an exceedingly extended ring core transducer geometry. The extremely elongate shape of the present invention's core beneficially affords magnetometric sensing which equates to an "averaging" of the magnetic field over a significant distance, viz., the length L of the core. The inventive sensor, when used in the normal fashion of a parallel-gated fluxgate magnetometer, automatically operates so as to "integrate" the sensed values of the magnetic field over the length L of the core.

Since the conventional racetrack core geometry has such a low L/D ratio (less than or approximately equal to four), it yields measurements which, for all practical purposes, are "point" measurements; indeed, the conventional wisdom has never attributed anything other than a "point" measurement to any fluxgate magnetometer. By comparison, the racetrack core geometry according to the present invention has a sufficiently high L/D ratio (greater than or approximately equal to ten) so that it yields measurements which, for all practical purposes, are true "multi-point" or "line" measurements. According to this invention, the magnetic field components are spatially integrated.

A typical fluxgate magnetometer in accordance with this invention includes a magnetic core, a first drive winding, a second drive winding and a sense winding. The magnetic core defines a closed magnetic flux path. The magnetic core describes an elongate oval shape having two longitudinal linear segments and two curvilinear segments. The longitudinal linear segments have the same length, are alignedly parallel and are separated by a distance which is no greater than about ten percent of their length. The first drive winding is wound with respect to the first longitudinal linear segment. The second drive winding is wound with respect to the second longitudinal linear segment. The sense winding is wound with respect to the first drive winding-wound first longitudinal linear segment and the second drive winding-wound second longitudinal linear segment. According to typical inventive methodology for sensing a magnetic field of a ferromagnetic entity, the fluxgate magnetometer is positioned so as to be approximately parallel with respect to a surface area of the ferromagnetic entity. An input signal is driven for the fluxgate magnetometer, using the drive winding. An output signal from said fluxgate magnetometer is detected, using the sense winding. Typically, the output signal manifests a value of the magnetic field which is integrative over the length of the two equal alignedly parallel longitudinal linear segments.

Thus featured by the present invention is a naturally occurring mathematically integrative function which advantageously serves to minimize the magnetic field measurement perturbations associated with anomalous portions of the region of interest, thereby more accurately assessing the magnetic field over the expanse of such region. Moreover, intrinsic to the inventive core's high L/D ratio is the invention's valuable potentiality for providing such core so as to be characterized by a very long core length L, practically approaching infinite length L. In other words, extremely great surface lengths and areas of entities can be integratively sensed by the present invention.

Related to (but distinguishable from) the inventive IFM is the inventive "Spatially Integrating Magnetometer" (SIM) which is disclosed by the aforementioned nonprovisional patent application being filed concurrently herewith entitled "Spatially Integrating Magnetometer." A typical Spatially Integrating Magnetometer (SIM) measures the magnetic field at discrete distributed points, or summation of all field components, along a "linear," flexible transducer element. According to many inventive SIM embodiments, a spatially integrating transducer magnetometer measures the magnetic field components (tangential and normal) over a very long linear region, at discrete points, and integrates component field values (the sum of the field component amplitudes) over the length of the spatially integrating tranducer magnetometer's sensor element. A typical inventive SIM: (i) measures magnetic field amplitude components over a very long linear region, at discrete points, and (ii) integrates these component field values (the sum of the field component amplitudes) over the length of the transducer element.

Also related to (but distinguishable from) the inventive IFM is the inventive "Ferromagnetic Surface Magnetic Field Sensor" (FSMFS) which is disclosed by the aforementioned nonprovisional patent application being filed concurrently herewith entitled "Ferromagnetic Surface Magnetic Field Sensor." Typically, the inventive HTS uses the ferromagnetic material of the measured entity as part of the transducer core in order to determine the magnetic characteristics of the measured entity. For instance, in a typical marine application, an inventive HTS uses the ferromagnetic ship hull material as part of the transducer core to determine its magnetic characteristics.

Also related to (but distinguishable from) the inventive IFM is the inventive "Standing Wave Magnetometer" (SWM) which is disclosed by the aforementioned nonprovisional patent application filed on Mar. 5, 1999 entitled "Standing Wave Magnetometer." In accordance with many embodiments of the inventive SWM, a methodology is provided for determining the distribution of a magnetic field in a spatial sector. According to a typical inventive SWM, a magnetic field amplitude value is measured at each of a plurality of points in the sector, wherein the means for measuring is characterized by a length which is defined by the points. Alternating current is applied at a high frequency having an associated wavelength which corresponds to a multiple of the length. The applied alternating current is conducted so as to establish a standing wave along the length. The measured magnetic field amplitude values are processed; this processing includes performing, over the multiple of the length, Fourier analysis based on a harmonic bias function which results from the standing wave.

The inventive IFM and the inventive SIM are similar, but differ in certain respects. According to many preferred inventive SIM embodiments, the inventive SIM basically represents an extension of the inventive IFM principal, but significantly departs from the inventive IFM transducer in terms of physical characteristics (e.g., rigidity versus flexibility), configuration, dimensions and adaptability. The IFM according to this invention is typically rigid. The inventive SIM is typically characterized by flexibility rather than rigidity and is typically much longer than the inventive IFM. Moreover, the inventive SIM is often characterized by greater complexity than is the inventive IFM, since the lengthy, flexible SIM can propitiously be associated with other sensors of various kinds.

The inventive SIM features a closed geometry magnetic core comprising a flexible (rather than rigid) core bobbin structure and an amorphous magnetic material which covers this flexible bobbin structure. Moreover, the inventive SIM features a closed magnetic core having two parallel magnetic core sections which are contiguously disposed in relation to each other. Essentially, the two parallel magnetic core sections are connected to each other at their respective ends, and are contiguously united to form a single, lengthy magnetic transducer characterized by a closed magnetic flux path.

An IFM according to this invention typically has an oblong-shaped bobbin core of rigid construction, wherein there is a space or separation between essentially linear sections of the bobbin core. On the other hand, an inventive SIM has a flexible construction wherein there is no space or separation between essentially linear sections of the bobbin core; that is, they are adjacent or contiguous. Like an inventive IFM, an inventive SIM is characterized by functionality of a closed core and by geometric indicia of an elongate "racetrack" core. Both an inventive IFM and an inventive SIM will typically be implemented so as to be at least slightly set apart (distanced) from the surface of the ferromagnetic material being sensed. A typical inventive SIM, however, is made to be much longer than a typical IFM.

The inventive SIM can have practically unlimited extent for covering very large ferromagnetic areas and entities. The SIM's magnetic core is typically made to be flexible so as to be capable of being conformally disposed along great distances of the ferromagnetic material being sensed. In effect, the SIM admits of neighboring, bordering or "lining" virtually anything of virtually any length. The SIM is typically embodied as a continuous narrow, flexible strip having a conjoined double-core configuration wherein the two flexible cores are longitudinally coupled so as to form a single flexible transducer. The SIM lends itself to being disposed at great distances like a tape, wire or cable.

There are numerous possible inventive applications wherein can be used, in accordance with the inventive principles of an IFM or SIM, a distributed integrating magnetic field sensor. Examples of military applications include underwater-based (e.g., as part of an underwater submarine barrier array, in naval mines, etc.) and land-based intrusion detection systems. Examples of commercial applications include geophysical prospecting (e.g., for minerals) and other physical studies. Another potential commercial application of either the inventive IFM or the inventive SIM is in the realm of traffic control (e.g., multi-lane vehicle detection). There are numerous applications of the inventive SIM wherein a large linear magnetic field sensor could be used, including underwater surveillance barriers and land based intrusion detection systems. The inventive SIM could also be used commercially for vehicle detection in traffic control systems, and in both internal and perimeter security systems. In general, the inventive IFM and the inventive SIM share many potential applications.

Other objects, advantages and features of this invention will become apparent from the following detailed description of the invention when considered in conjunction with the accompanying drawings.

BRIEF DESCRIPTION OF THE APPENDICES

The following appendix is hereby made a part of this disclosure:

Attached hereto marked "APPENDIX A" and incorporated herein by reference is a copy of the following technical report: Scarzello, John F. and Edward C. O'Keefe, "Development of Shipboard Magnetic Sensors for Degaussing System Controllers," NSWCCD-TR-98/011, Jun. 30, 1998, Machinery Research and Development Directorate Research and Development Report, Naval Surface Warfare Center, Carderock Division, West Bethesda, Md. 20817-5700 ("Distribution limited U.S. Government agencies and their contractors; test and evaluation (Jun. 30, 1998). Other requests for this document shall be referred to Carderock Division, Naval Surface Warfare Center (Code 854), West Bethesda, Md. 20817-5700.").

This report marked APPENDIX A includes 93 pages, including 43 pages of drawings. This report also contains forty-three illustrations and three tables, as follows: FIG. 1-1 through FIG. 1-4; FIG. 2-1 through FIG. 2-4; FIG. 3-1 through FIG. 3-9; FIG. 4-1 through FIG. 4-11; FIG. 5-1 through FIG. 5-7; FIG. 6-1 through FIG. 6-5; FIG. 7-1 through FIG. 7-3; Table 8-1 through Table 8-3.

See, especially, Chapters 2 through 5 of APPENDIX A.

BRIEF DESCRIPTION OF THE DRAWINGS

In order that the present invention may be clearly understood, it will now be described, by way of example, with reference to the accompanying drawings, wherein like numbers indicates the same or similar components, and wherein.

DETAILED DESCRIPTION OF THE INVENTION

Fluxgate magnetometers have been developed to measure magnetic fields since the late 1930's. They use a ferromagnetic material as the transducer element, which is cyclically driven into saturation, which controls the flux in the core. To measure the controlled flux-driven core plus that provided by the external or ambient magnetic field, the field-dependent induced second harmonic signal of the saturated core is measured, and compared to the second harmonic of the drive signal, the amplitude of which is proportional to the ambient field intensity, with phase corresponding to field polarity.

The figures herein generally depict the U.S. Navy's prototype "Integrating Fluxgate Magnetometer" ("IFM") 20, the inventive fluxgate transducer magnetometer. IFM 20 utilizes a principle of the fluxgate magnetometer; however, with reference to FIG. 1 through FIG. 3, the present invention's IFM 20 applies the principle to a large "integrating" racetrack transducer core 22. IFM 20 measures the magnetic field amplitude component over a linear region, and integrates the measured values to obtain the sum of the field component amplitudes over the length L of core 22 (the sensor element of IFM 20).

Figure 1:
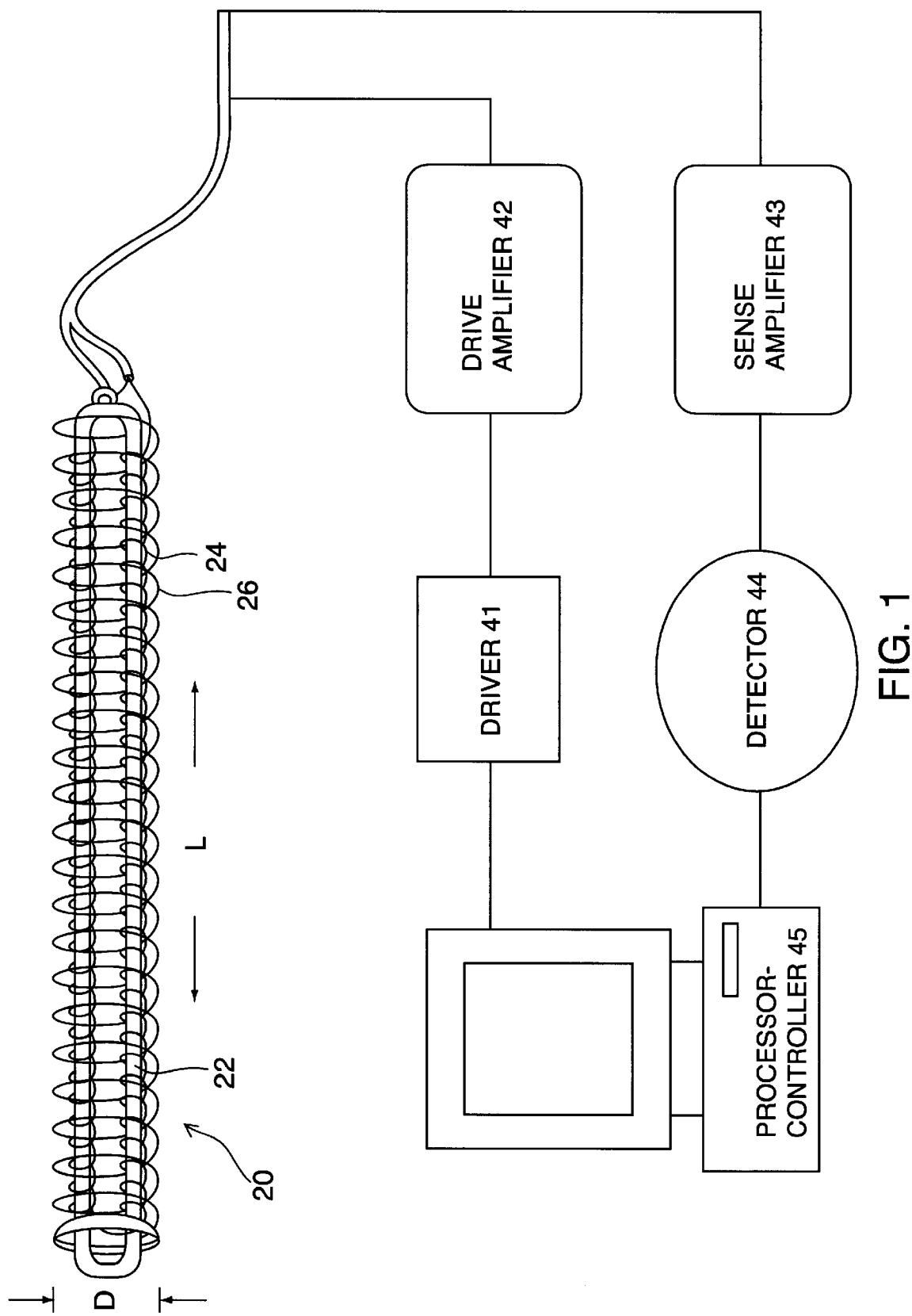
FIG. 1 is a diagrammatic schematic and perspective cutaway view of an embodiment of an "Integrating Fluxgate Magnetometer" ("IFM") and associated electronics in accordance with the present invention. The IFM shown is representative of a U.S. Navy prototype thereof.
Figure 2:
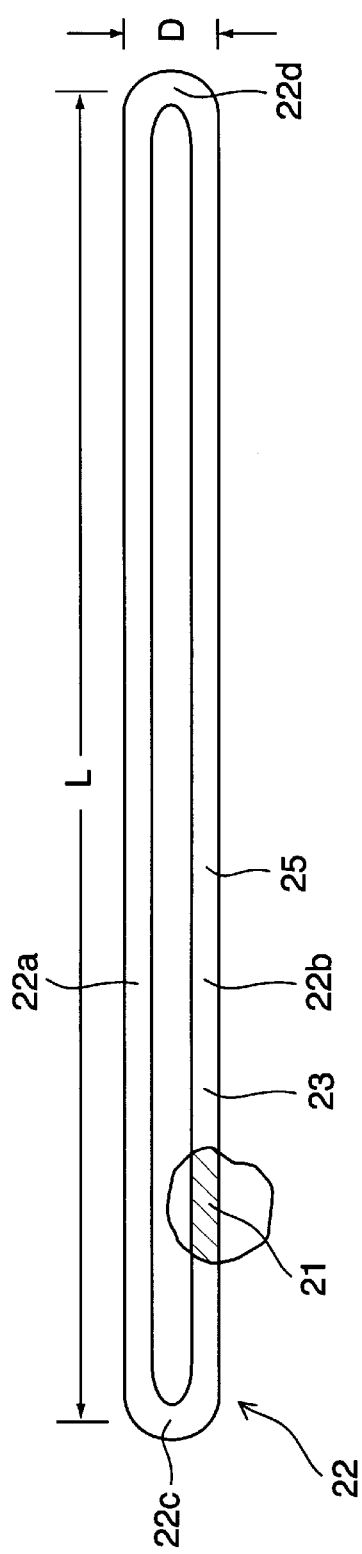
FIG. 2 is a diagrammatic cutaway plan view of the U.S. Navy prototype IFM shown in FIG. 1, depicting the amorphous magnetic material bobbin core.
Figure 3:
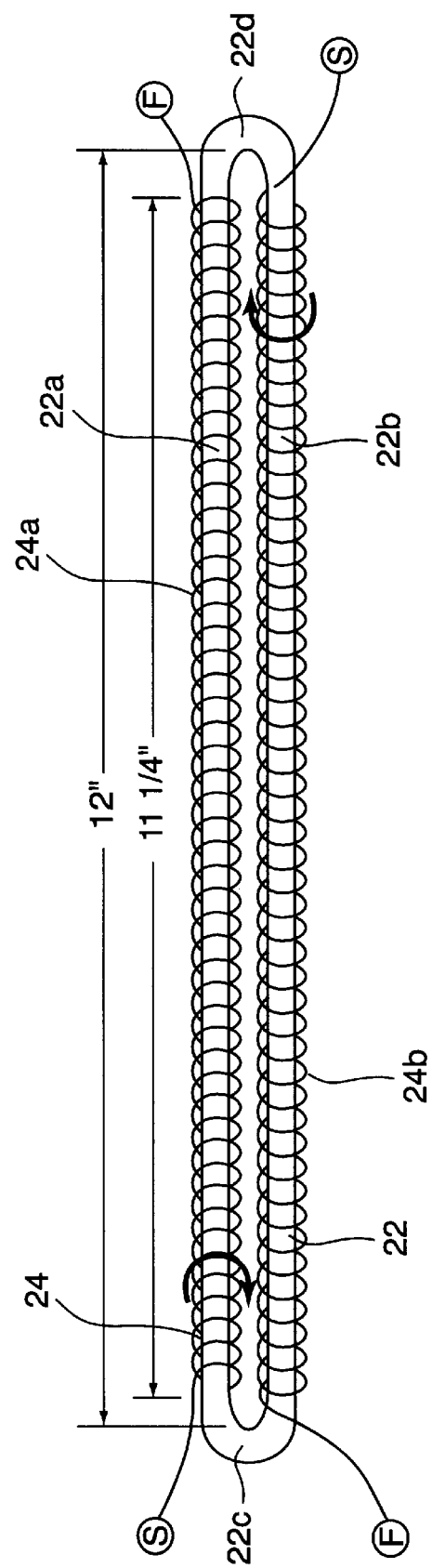
FIG. 3 is a diagrammatic cutaway plan view of the U.S. Navy prototype IFM shown in FIG. 1, depicting the drive winding which is wound about the bobbin core shown in FIG. 2.

According to many inventive IFM embodiments, the integrating transducer core 22 comprises amorphous magnetic material wrapped around a bare racetrack bobbin. For example, as shown in FIG. 1 through FIG. 3, plural wraps of amorphous magnetic material "tape" core 23 are disposed on a very dimensionally stable race track bobbin core 21. Core bobbin 21 defines the shape of magnetic core 22. According to the U.S. Navy's IFM 20 prototype, integrating transducer core 22 comprises approximately ten wraps of amorphous magnetic material "tape" core 23, on a rigid race track bobbin core 21 having dimensions approximately three-eighths of an inch (0.42 cm) wide by approximately twelve inches (30 cm) long; i.e., core diameter (width) D=⅜in and core length L=12 in, resulting in an L/D ratio of approximately thirty. This core geometry essentially "integrates" or sums all magnetic field component amplitudes at each "point" along the core, to obtain one value of field.

FIG. 1 through FIG. 6 together illustrate the main components and contruction details of a U.S. Navy prototypical embodiment of IFM 20. "Drive" winding 24 is wound about magnetic tape-wrapped bobbin core 22. "Sense" winding 26 is wound about rectangular sense winding bobbin 28 and surrounds drive winding 24. "Feedback" winding 30, frequently a preferred component of the IFM 20 system, is wound about tubular feedback winding bobbin 32 and surrounds sense winding 26. IFM 20 can also include a housing 34, such as that which id diagrammatically shown in FIG. 1, for encasing, containing or enclosing the interior parts.

Particularly referring to FIG. 1 through FIG. 3, the inventive IFM 20 transducer magnetic material core 22 geometry is shown to be an elongated "racetrack" configuration. FIG. 2-2 (page 2-4) of APPENDIX A is a juxtapositional photographic representation of a typical conventional "ring core" magnetometer transducer, and of a prototype inventive "racetrack" IFM transducer 20 such as represented in the figures herein.

Core 22 has two parallel linear core subsections 22a and 22b, and two opposite end curved core subsections 22c and 22d. As shown in FIG. 1 and FIG. 3, IFM 20 has a toroidally wound drive winding 24, which applies a magnetic field to the magnetic material 23 of core 22 to cyclically drive it into saturation at a frequency typically in the audio range. Drive winding 24 includes a pair of drive subwindings 24a and 24b, which are wound about core 22's linear subsections 22a and 22b, respectively.

Figure 4:
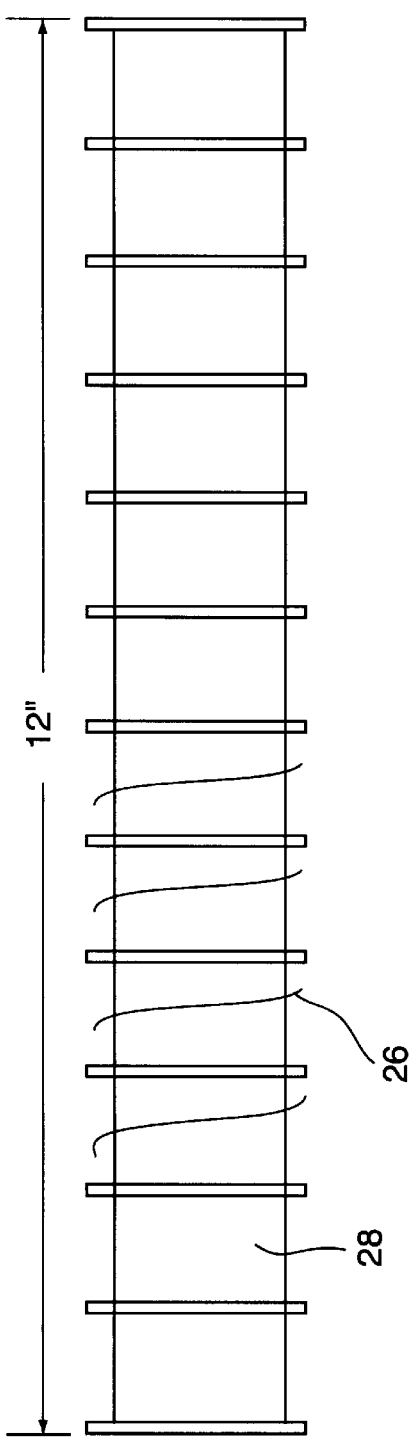
FIG. 4 is a diagrammatic plan view of the U.S. Navy prototype IFM shown in FIG. 1, depicting the sense winding bobbin about which the sense winding is wound; the sense wound bobbin which surrounds the drive wound bobbin core shown in FIG. 3.

Solenoidal sense winding 26 is wound on a bobbin 28, such as shown in FIG. 4, which completely surrounds the magnetic 22. Sense winding 26 senses the induced ambient magnetic field dependent second harmonic signal. The induced second harmonic signal in sense winding 26 is a direct measure of the ambient magnetic field, whose amplitude and polarity are detected over a limited range of magnetic field amplitudes, which depends on the dynamic range of the signal amplifiers and detector electronics.

Since the inventive prototype IFM 20 represented in the drawings is intended to be operated near a ship's ferromagnetic hull, it must operate over a large dynamic range of ambient field values while preserving the minimum field resolution. To do this, core 22 together with sense winding 26 is positioned in the middle of a third solenoidal winding, viz., feedback winding 28. Feedback winding 28 is used to impress a precise field on magnetic core 22, so that the IFM 20 sensor continues to operate within its dynamic (linear magnetic field sensitive) range.

In addition to developing ring core fluxgate magnetometers, NASA and the now-defunct NSWC White Oak have also developed stable very low noise transducer magnetic material alloys and electronics which have been used on many deep space magnetometer sensors. Low-noise, fluxgate ring core transducers generally use moly permalloy or amorphous magnetic material, e.g., a thin-rolled soft magnetic metal tape (½-mil thick×⅛-inch wide) having a composition of 6% Molybdenum, 81% Nickel and 14% Iron (6-81 Moly permalloy). At the time of U.S. Navy testing of inventive IFM prototypes, NSWC White Oak and Infinetics, Inc. (Wilmington, Del.) were believed to be the only two suppliers of this low noise permalloy material, and the cost and quantity of material available were not sufficient to fabricate two special IFM cores 20.

Hence, in order to demonstrate the inventive IFM concept, the present invention's prototype IFM transducer core 20 utilized newly developed amorphous magnetic material tape, which was made using rapid solidification technology ("RST"). The amorphous material was in the form of a tape 23; since this material was amorphous, it could be wound on the racetrack core bobbin 21 and be operated without a post-fabrication anneal. Bobbin 21 was made of a nonmagnetic stainless steel alloy material. Bobbin 21 was machined from INCONEL X-750 bobbin for dimensional stability; that is, it had a similar coefficient of thermal expansion to core materials in order to reduce mechanical stress on the magnetic material. In inventive practice, there are newer, low-noise, amorphous magnetic materials in both tape and wire shapes which could be used, along with "standard" moly permalloy materials, for IFM transducer cores 22.

The naked bobbin core 21 is wound with ten wraps of amorphous magnetic material tape 23 which is approximately 0.003 inches thick by 0.074 inches wide. The magnetic tape material 23 is "cleanly" cut and attached to the end of the bobbin 21 using a liquid adhesive, and is coated with a thin layer of MgO powder dissolved in trichlorethylene as it is wound on the bobbin 21. After the desired number of complete tape wraps of material 23 are wound, material 23 is cleanly cut and attached to the next layer using a liquid adhesive directly above, but slightly overlapping, the tape 23 start location.

At this point, amorphous material core 22 can be annealed to enhance its magnetic characteristics, as is routinely done with permalloy alloys. Annealing temperature and fields must be well controlled, as amorphous material Curie and re-crystallization temperatures may be quite close. The IFM 20 transducer cores 22 used for this demonstration were not annealed after core fabrication. Pre-annealing amorphous magnetic material tape has also been done successfully for similar transducers.

Magnetic bobbin core 22 is insulated from drive winding 24 using an overlapping layer 25 of Teflon tape, depicted in FIG. 2. Then, a drive winding 24 of #36 HF is toroidally wound on the magnetic bobbin core 22, such as diagrammatically illustrated in FIG. 1 and FIG. 3. Drive subwinding 24a and drive subwinding 24b are wound at opposite orientations with respect to each other. Drive winding 24 (including subwindings 24a and 24b) is wound only over the linear homogenous portion (including sections 22a and 22b) of bobbin core 22 and is kept away from the ends, one of which is joined together with adhesive. The welded or joined tape material 25 ends have been known to cause changes in offset and decrease the overall sensor stability with respect to temperature induced stress, vibration, and shock.

Drive winding 24 had to be wound by hand (using a shuttle loaded with wire), because of the large transducer 20 length/diameter ratio L/D, and because the U.S. Navy's toroidal winding machine (at the Naval Surface Warfare Center, Carderock Division, West Bethesda, Md.) only has shuttles for winding ring core transducers, and parts could not be ordered as the company went out of business. However, a modern toroidal coil winding machine with a smaller shuttle could automate this process. As shown in FIG. 3, the two drive subwindings 24a and 24b are connected in series, i.e., Start S to Finish F one winding, to S to F of the second which maintains drive field polarity. In accordance with this invention, the drive windings may also be connected in parallel, i.e., "S1–S2" and "F1–F2."

Figure 5:
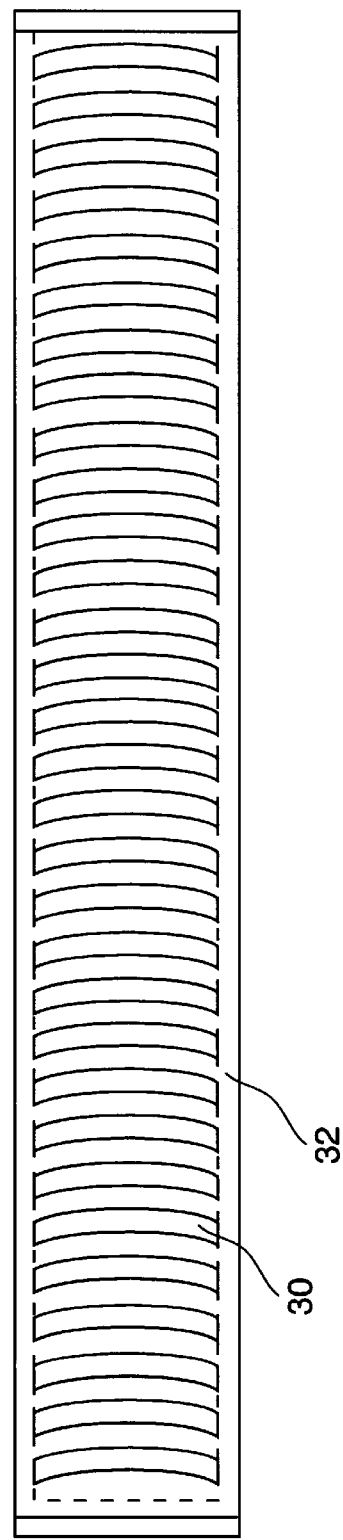
FIG. 5 is a diagrammatic cutaway plan view of the U.S. Navy prototype IFM shown in FIG. 1, depicting the feedback winding bobbin about which the feedback winding is wound; the feedback wound bobbin surrounds the sense wound bobbin shown in FIG. 4.

With reference to FIG. 4 and FIG. 5, the ambient field dependent induced second harmonic signal is generated in a sense winding 26 surrounding the transducer core 22 with its drive windings 24. The induced signal is greatest if sense winding 26 is close to the generating source, thereby minimizing the "filling factor" loss. Two versions of sense winding 26 were made by the U.S. Navy for the testing, each version corresponding to a different prototype IFM 20. The first sense winding 26 version was designed to fit a 12-inch long segmented rectangular sense winding bobbin 28 which fits snugly over the core, such as shown in FIG. 4. The second sense winding 26 version was designed to fit a fiberglass tube bobbin 28 (not shown) the inside diameter of which is close to the cross-sectional diameter of transducer core 22.

According to the first IFM 20 prototype, the combination of sense winding 26 and rectangular molded plastic bobbin 28 has 11 sections (0.85 inches) separated by ⅛ inches for a total length of 12 inches. As portrayed in FIG. 4, each section has 5 layers of #36HF wire, 141 turns per layer, 705 turns/segment and 7755 turns for sense winding 26. According to the second IFM 20 prototype, the fiberglass tubular sense winding bobbin 28 and sense windings 26 were similar, i.e., approximately 150 turns/layer×3×12=5400 turns; however, because of the expected higher filling factor signal loss, a 12-wrap core is used for the second IFM 20 prototype.

A feedback winding 30 is placed over the sense bobbin winding 26. Feedback winding 30 applies a DC field to maintain the fluxgate sensor 20 operating in its linear region. In both IFM 20 prototypes, a tubular fiberglass bobbin 32 is utilized. As shown in FIG. 5, fiberglass tube bobbin 32 is wound with #36 HF wire in 4 layers to provide an approximately 8070-turn feedback winding 30. Generally, sense bobbin 28 and feedback winding 30 will be made of a rigid nonmagnetic material such as plastic (e.g., molded plastic) or fiberglass.

Transducer core 22 is driven into saturation using drive winding 24, which applies a relatively large magnetizing force to insure that magnetic material 23 is completely saturated ($\approx 1.0$ Oersted, which is much greater than the material's coercive force, wherein $H_c=0.03$ Oe). The maximum amplitude of the induced voltage in sense winding 26 can be approximately calculated using the formula, $$E=4.44\ NfBA \times 10^{-8}\ V_{rms},$$

where:
  N=number of sense winding turns, 705T×11 segments= 7755 T
  f=drive frequency, 1 KHz
  A=cross sectional area of the core (0.074 inches×0.003 inches×# wraps)=0.0172 cm² (12 wraps), 0.0143 cm² (10 wraps)
  B=induction from drive field for minimum approximately 1000 Gauss for an approximate drive flux ō=BA of 17 maxwells
  E=4.44 (7755)(1000)(17)×10⁻⁸ approximately=5.8 $V_{rms}$.

Referring again to FIG. 1, IMF 20 is in connective relationship with various electronics, including electric driver 41, drive signal amplifier 42 (which is connected to driving winding 24), sense signal amplifier 43 (which is connected to sense winding 26), phase detector 44 and processor-controller 45. The ordinarily skilled artisan is well acquainted with electronic methodologies pertaining to fluxgate magnetometers. In practicing the Navy's prototype IMF, the sense signal amplifier 43 should be designed to expect a certain maximum fundamental amplitude (e.g., 5.8 volts), and be tuned to amplify the second harmonic field dependent signal. Detailed design of the signal amplifier, detection and control electronics associated with the prototypical IMF 20 is found in Chapter 3 of APPENDIX A.

Figure 6:
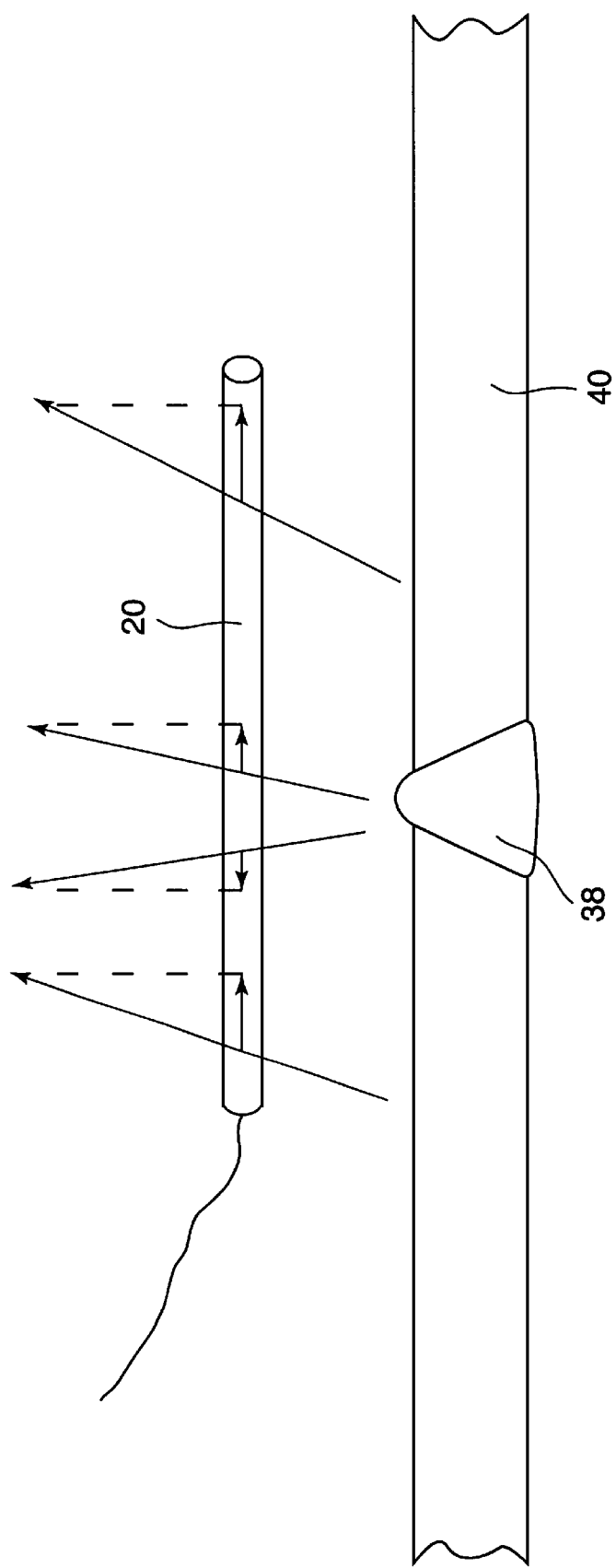
FIG. 6 is a diagrammatic perspective view of the U.S. Navy prototype IFM shown in FIG. 1, illustrating it's implementation in proximity to a ship hull plate and weld.

The present invention's integrating fluxgate magnetometer is potentially useful in many applications. For instance, an IFM 20 such as that which is exemplified herein can be implemented in the context of ship applications involving degaussing. FIG. 6 illustrates possible hull magnetic field anomalies from a weld 38 in a hull plate 40, and how the inventive IFM transducer 20 would spatially "integrate" the magnetic field component measurements over the length L of the inventive IFM transducer 20. The IFM 20 transducer measures the component of the local anomaly gradient fields, but the local anomaly effects are "averaged" over the length of the transducer. Localized field anomaly gradients are averaged by IFM 20, thereby providing sensor data which can be used by degaussing control algorithms to minimize ship signatures.

Based on U.S. Navy testing, the ability of IFM 20 to measure an "integrated" component of magnetic field appears to reduce the field variations associated with local magnetic anomalies. The U.S. Navy's IFM 20 prototype demonstrates the inventive concept of spatially integrating magnetic component field amplitudes over a well defined transducer element. Although the spatial dimensions of the prototypical IFM 20 were constrained to twelve inches in testing conducted by the U.S. Navy, the inventive principles should apply to much longer transducer cores.

FIG. 6 conceptionally illustrates how the field component measurement variations over the length of the IFM 20 transducer are "averaged." The IFM 20 transducer core 22 was designed to be physically located close to the ship's hull, ferromagnetic machinery and the high fields caused by ship deperming treatments. Accordingly, as shown in Table 1, below, prototypical IFM 20 had the following specifications.

TABLE I

| | |
|---|---|
| DYNAMIC RANGE | ±25 Oersted |
| LINEARITY | <0.05% |
| ABSOLUTE STABILITY | <10 nT |
| NOISE | 0.1 nT, DC to 3 Hz/10 minutes |
| POWER CONSUMTPION | <5 Watts/Axis |
| TRANSDUCER SIZE | 30-cm × 1-cm dia |

Some photographs contained in APPENDIX A are noteworthy in relation to the present invention. Shown in FIG. 2-2 (page 2-4) of APPENDIX A is a photograph of the finished IFM 20 transducer, along with a typical 1-inch diameter ring core sensor attached to a noise screening test board used for selecting sensor cores. FIG. 5-2 (page 5-4) of APPENDIX A is a pair of photographs showing, aboard the USNS Hiddensee, the main control computers hosting the CLDG algorithms and the data acquisition system hardware and coil amplifier current electronics. FIG. 5-3 (page 5-6) of APPENDIX A is a photograph of a finished IFM situated next to the hull, during the USNS Hiddensee testing.

Figure 7:
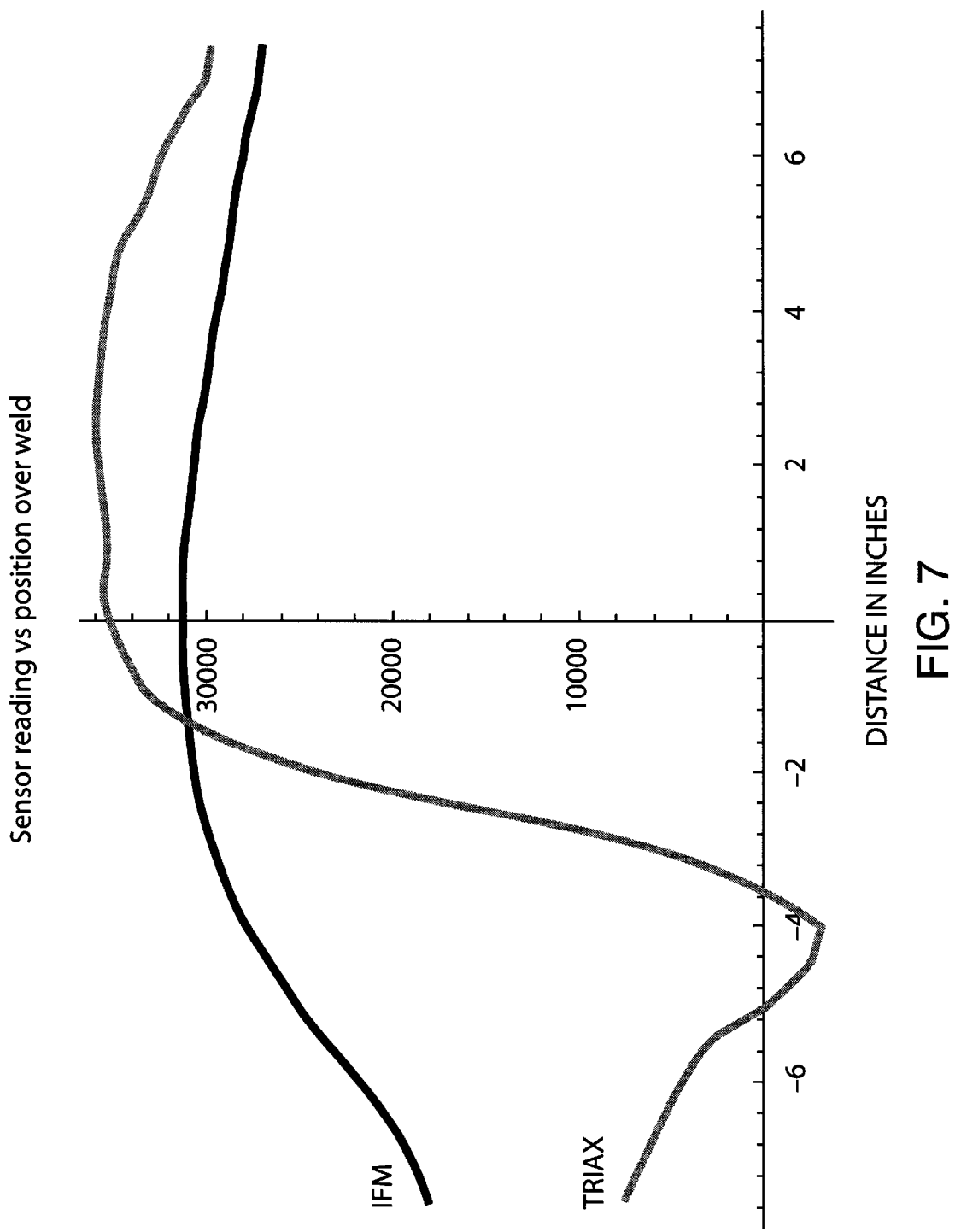
FIG. 7 is a graphical representation comparing measured magnetic field values obtained using the U.S. Navy prototype IFM shown in FIG. 1, versus those obtained using a conventional triaxial magnetometer, during U.S. Navy testing aboard the USNS Hiddensee.

Referring to FIG. 7, the graph shows measured field values, in connection with USNS Hiddensee testing, when IFM 20 is moved across weld 38 situated in hull plate 40, such as illustrated in FIG. 5. As comparatively shown in FIG. 6, a triaxial magnetometer whose component is parallel to the hull has a much larger variation in field with respect to distance from the weld; both IFM 20 field amplitudes and triaxial component field amplitudes appear to approach the same value on both sides of the weld.

The present invention's ability to measure an "integrated" component of magnetic field appears to reduce the field variations associated with local magnetic anomalies. This was demonstrated in the U.S. Navy's USNS Hiddensee testing. The advantage afforded by the present invention's sensor measurement in relation to control of advanced degaussing systems is being examined in the U.S. Navy's Advanced Degaussing Technology program, and can be more meaningfully evaluated during full scale ship experiments.

In inventive practice, IFM 20 will generally be positioned so as to be approximately parallel to and at least slightly distanced from the surface of the ferromagnetic material being sensed. According to many applications thereof, IFM 20 will be near, or will border upon or adjoin a significant extent of the ferromagnetic surface. The inventive SIM and the inventive FSMFS will each also be at least slightly distanced from the ferromagnetic material surface. Neither the inventive IFM, nor the inventive SIM, nor the inventive FSMFS will each also be at least slightly distanced from the ferromagnetic material surface. Neither the inventive IFM, nor the inventive SIM, nor the inventive FSMFS is dimensionally or configurationally unwieldy; in ship applications, the inventive IFM and/or the inventive SIM and/or the inventive HSMFS can be rather facilely integrated with a ship or submarine hull, giving reliable performance without necessitating inordinate amounts of hull penetrations and conductors. The U.S. Navy envisions embedding or incorporating IFM 20 in a relatively thick coating provided on the ferromagnetic hull, whereby IFM 20 adjoins the ferromagnetic hull surface but is proximately separated therefrom. The inventive SIM and the inventive HSFMS can also be embedded in the ship's hull in this manner.

The inventive IFM 20 prototype demonstrates the inventive concept of spatially integrating magnetic component field amplitudes over a well defined transducer element. Although the spatial dimensions of the Navy's prototype IFM 20 were constrained to 12 inches, the present invention's integrating fluxgate magnetometer should also be applicable to much longer transducer cores 22.

The inventive fluxgate magnetometer measurement methodology has been applied to a "lumped" transducer, but could also be applied to distributed integrating magnetic field gradiometers, using either the same transducer core, or several IFM elongated cores driven together. Moreover, although the inventive prototype IFM is a single component magnetometer, the present invention could also provide an inventive multiaxial IFM—for example, an inventive triaxial IFM wherein common drive together. Moreover, although the inventive prototype IFM is a single component magnetometer, the present invention could also provide an inventive multiaxial IFM—for example, an inventive triaxial IFM wherein common drive electronics and three synchronous detectors are utilized. In addition, the long linear distributed tranducer sensor element provided by the inventive fluxgate magnetometer can implement fluxgate magnetic cores (e.g., ring cores, scrolls, helix, race track cores, etc.) or other magnetic field sensitive transducer physical phenomena. Of particular note, an inventive SIM can have embedded therein or otherwise associated therewith at least one inventive IFMs and/or at least one "Ferromagnetic Surface Magnetic Field Sensor" ("FSMFS").

As regards both the IFM and the SIM, either of these inventive magnetic sensor systems can be efficaciously (and perhaps preferably) utilized in practicing many embodiments of the novel "Standing Wave Magnetometer" ("SWM") invention which is disclosed in the aforementioned U.S. nonprovisional patent application Ser. No. 09/262,932 filed Mar. 5, 1999.

In inventive standing wave magnetometer practice, an inventive SIM can be configured for point measurement or for spatially integrating measurement. For instance, according to some inventive standing wave magnetometer embodiments, an inventive SIM fluxgate sensor can be designed to be the inner conductor of a coaxial cable RF transmission line. A pertinent principle of the inventive standing wave magnetometer would be that, in an RF transmission line, there are magnetic and electric components to a propagating wave; that is, there are maximum and minimum magnetic field components related to the frequency (wavelength) of the standing wave. In inventive fashion, the positions of the maximum and minimum magnetic field amplitudes can be varied so that field measurements can be computed at each point along the cable by varying the frequency in the coaxial transmission line.

According to some inventive standing wave magnetometer embodiments, an inventive SIM configuration can include plural fiber-optic magnetic field sensors using magnetorestrictive materials in a standing wave RF transmission line. Or, some inventive standing wave magnetometer embodiments can include a Faraday rotation detector using a fiber-optic material with a very high Verdet effect; the Faraday fiber-optic wave guide would be part of an RF transmission line.

Other embodiments of the inventions disclosed herein will be apparent to those skilled in the art from a consideration of this disclosure or practice of the invention disclosed herein. Various omissions, modifications and changes to the principles described may be made by one skilled in the art without departing from the true scope and spirit of the invention which is indicated by the following claims.

What is claimed is:

1. A fluxgate magnetometer comprising a magnetic core, two drive windings and a sense winding, said magnetic core being characterized by a closed magnetic flux path, a core length, a core width and a ratio of said core length to said core width of at least ten, said magnetic core having two approximately straight approximately equal lengthwise core portions and two arcuate end portions, said lengthwise core portions being approximately oriented in rectangular parallel relation, each said lengthwise core portion being characterized by approximately the same lengthwise core portion length which is substantially said core length, each said drive winding being wound over one said lengthwise core portion, said sense winding being wound encompassingly with respect to the combination of said two lengthwise core portions and said two drive windings.

2. The fluxgate magnetometer of claim 1, wherein said fluxgate magnetometer is adaptable to transmitting, via said sense winding, an electrical signal which is integratively indicative of the sensed magnetic field components over said lengthwise core portion length.

3. The fluxgate magnetometer of claim 1, wherein said magnetic core includes a rigid nonmagnetic core bobbin and amorphous magnetic material disposed on said nonmagnetic core bobbin.

4. The fluxgate magnetometer of claim 3, wherein said nonmagnetic material is made of stainless steel.

5. The fluxgate magnetometer of claim 1, further comprising a rigid sense bobbin at least substantially enclosing the combination of said two lengthwise core portions and said two drive windings, wherein said sense winding is wound on said sense bobbin.

6. The fluxgate magnetometer of claim 1, wherein said sense bobbin is made of a material selected from the group consisting of plastic and fiberglass.

7. The fluxgate magnetometer of claim 1, further comprising a feedback winding which is wound encompassingly with respect to the combination of said two lengthwise core portions, said two drive windings and said sense winding.

8. The fluxgate magnetometer of claim 7, further comprising a feedback bobbin at least substantially enclosing the combination of said two lengthwise core portions, said two drive windings and said sense winding, wherein said feedback winding is wound on said feedback bobbin.

9. The fluxgate magnetometer of claim 8, wherein said feedback bobbin is made of a material selected from the group consisting of plastic and fiberglass.

10. Fluxgate apparatus for sensing the magnetic field of a ferromagnetic entity, said fluxgate apparatus comprising:

a magnetic core which defines a closed magnetic flux path, said magnetic core describing an elongate oblong shape having two longitudinal linear segments and two curvilinear segments, said two longitudinal linear segments being a first longitudinal linear segment and a second longitudinal linear segment, said first longitudinal linear segment and said second longitudinal linear segment having the same length, being alignedly parallel and being separated by a distance which is no greater than ten percent of said length;

drive winding means including a first drive winding and a second drive winding, said first drive winding being wound on said first longitudinal linear segment, said second drive winding being wound on said second longitudinal linear segment; and sense winding means including a sense winding which is wound so as to surround both said first drive winding and said second drive winding.

11. Fluxgate apparatus according to claim 10, further comprising a sense bobbin, wherein said sense winding is wound on said sense bobbin.

12. Fluxgate apparatus according to claim 10, wherein said fluxgate apparatus is capable of generating an output signal which is detectable through connection with said sense winding, and wherein said output signal represents the integration of magnetic field components over said length.

13. Fluxgate apparatus according to claim 12, further comprising feedback winding means including a feedback winding which is wound so as to surround said sense winding.

14. Fluxgate apparatus according to claim 13, further comprising:

driver-and-amplification means connected to said first drive winding and said second drive winding, for generating an input signal;

amplification-and-detector means connected to said sense winding, for ascertaining said output signal; and controller-processor means connected to said driver-and-amplification means, said amplification-and-detector means and said feedback winding, for regulating said input signal and said output signal and acquiring information pertaining thereto.

15. Fluxgate apparatus according to claim 13, further comprising a feedback bobbin, wherein said feedback winding is wound on said feedback bobbin.

16. A method for sensing a magnetic field of a ferromagnetic entity, said method comprising:

providing a fluxgate magnetometer which includes a magnetic core, a first drive winding, a second drive winding, and a sense winding, said magnetic core defining a closed magnetic flux path, said magnetic core describing an elongate oblong shape having two longitudinal linear segments and two curvilinear segments, said longitudinal linear segments having the same length, being alignedly parallel and being separated by a distance which is no greater than about ten percent of said length, said first drive winding being wound with respect to said first longitudinal linear segment, said second drive winding being wound with respect to said second longitudinal linear segment, said sense winding being wound with respect to said first drive winding-wound first longitudinal linear segment and said second drive winding-wound second longitudinal linear segment; and positioning said fluxgate magnetometer so as to be approximately parallel with respect to a surface area of said ferromagnetic entity.

17. A method for sensing a magnetic field as recited in claim 16, further comprising:

driving an input signal for said fluxgate magnetometer, said driving including using said drive winding; and detecting an output signal from said fluxgate magnetometer, said detecting including using said sense winding.

18. A method for sensing the magnetic field as recited in claim 17, wherein said output signal manifests a value of said magnetic field which is integrative over said length.

19. A method for sensing the magnetic field as recited in claim 16, wherein said positioning includes positioning said fluxgate magnetometer so as to be in proximity to said surface area.

20. A method for sensing the magnetic field as recited in claim 16, wherein said positioning includes positioning said fluxgate magnetometer so as to at least substantially border upon said surface area.

* * * * *